(12) United States Patent
Itasaka

(10) Patent No.: US 6,543,108 B1
(45) Date of Patent: Apr. 8, 2003

(54) METHOD OF DESIGNING A PIEZOELECTRIC COMPONENT

(75) Inventor: Yasuhiro Itasaka, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/501,088

(22) Filed: Feb. 9, 2000

(30) Foreign Application Priority Data

Feb. 25, 1999 (JP) .......................................... 11-047602

(51) Int. Cl.⁷ .............................................. H04R 17/00
(52) U.S. Cl. ...................... 29/25.35; 310/354; 310/355
(58) Field of Search ............................. 29/25.35, 609.1, 29/594, 595; 324/729, 76.49; 310/354, 355

(56) References Cited

U.S. PATENT DOCUMENTS

| 4,308,482 | A | * | 12/1981 | Kadohasi ...................... 310/354 |
| 4,382,203 | A | * | 5/1983 | Tribby ........................ 310/355 |
| 4,608,509 | A | * | 8/1986 | Yamamoto .................... 310/357 |
| 4,695,756 | A | * | 9/1987 | Tanaka ........................ 310/355 |
| 4,864,259 | A | * | 9/1989 | Takamora .................... 333/189 |
| 5,159,302 | A | * | 10/1992 | Tanaka ........................ 333/189 |
| 5,543,763 | A | * | 8/1996 | Oyama ........................ 333/189 |
| 5,616,981 | A | * | 4/1997 | Nagano ....................... 310/326 |
| 5,669,126 | A | * | 9/1997 | Nagano ....................... 29/25.35 |
| 6,081,066 | A | * | 6/2000 | Tsutsui ....................... 310/348 |

* cited by examiner

Primary Examiner—Carl J. Arbes
Assistant Examiner—Alan Boswell
(74) Attorney, Agent, or Firm—Keating & Bennett, LLP

(57) ABSTRACT

A method of designing and manufacturing a piezoelectric component which includes a case, a piezoelectric resonator in the case, a terminal including an external connecting portion extending from an opening of the case, and a spring member to contact the piezoelectric resonator and the terminal in the thickness direction, includes the step of designing the spring member such that the piezoelectric resonator and the terminal are held by a holding pressure in range not larger than Fmax when a spring height is Smax, where a thickness range of the piezoelectric resonator, the terminal and the spring member is not smaller than the minimum value of Tmin and not larger than the maximum value of Tmax, a dimension, range of the case interior is not smaller than the minimum value of Wmin and not larger the maximum value of Wmax.

16 Claims, 7 Drawing Sheets

METHOD OF DESIGNING A PIEZOELECTRIC COMPONENT

BACKGROUND OF THE INVENTION

1. Field of the Invention

The present invention relates to a method of designing a piezoelectric component used as a ladder filter, an oscillator, a discriminator, or other electronic component. More particularly, the present invention relates to a method of designing a piezoelectric component in which a piezoelectric element and a terminal are secured in position by a holding pressure applied in the thickness direction.

2. Related Art

Typically, in such a piezoelectric component, a piezoelectric resonator, a terminal, and a spring member are contained in a case. The piezoelectric resonator and the terminal are held by a holding pressure which is applied in the thickness direction and generated by the spring member. Further, the interior of the case is sealed by providing a lid including a resin permeation prevention sheet and a resin at the opening of the case. The piezoelectric resonator and the terminal are electrically connected to each other by the holding pressure applied by the spring member.

Such a piezoelectric component inevitably experiences variation in the thickness of the piezoelectric resonator, the terminal and the spring member and the variation of the interior-dimension of the case.

Therefore, if the variation of the dimensions of each of the piezoelectric resonator, the terminal and the spring member is small, a contact pressure (holding pressure) of the piezoelectric resonator and the terminal becomes small. As a result, poor connection occurs and the reliability of the shock resistance is greatly decreased.

On the other hand, if the variation of the dimensions of each of the piezoelectric resonator, the terminal and the spring member is large, a contact pressure (holding pressure) of the piezoelectric resonator and the terminal becomes large, and thereby the assembly of the component becomes very difficult. Further, there is a problem that an electric characteristic is deteriorated because of too much damping of the piezoelectric resonator.

To overcome the above described problems, conventionally, the contact pressure is stabilized by making uniform the thickness of the components contained in the case via lap polishing of the piezoelectric resonator or aligning the thickness of the terminal when forming thereof.

However, in the above described methods, the alignment process is very expensive and requires great effort.

SUMMARY OF THE INVENTION

To overcome the above described problems, preferred embodiments of the present invention provide a method of manufacturing a piezoelectric component which reliably and consistently achieves an appropriate contact pressure even if the variation of the thickness of the components constituting the piezoelectric component occurs.

According to a preferred embodiment of the present invention, a method of manufacturing a piezoelectric component includes the steps of providing a case having an opening, placing a piezoelectric resonator in the case, arranging a terminal including a external connecting portion to extend from the opening of the case toward outside of the case, and arranging a spring member in the case so as to maintain contact with the piezoelectric resonator and the terminal in the thickness direction, and designing the spring member such that the piezoelectric resonator and the terminal are held by a holding pressure in a range not larger than $F_{max}$ when a spring height is $S_{min}$ and not smaller than $F_{min}$ when a spring height is $S_{max}$, where a thickness range of the piezoelectric resonator, the terminal and the spring member is not smaller than the minimum value of $T_{min}$ and not larger than the maximum value of $T_{max}$, a dimension range of the case interior is not smaller than the minimum value of $W_{min}$ and not larger than the maximum value of $W_{max}$, a permissible holding pressure range of the piezoelectric resonator and the terminal is not smaller than the minimum value of $F_{min}$ and not larger than the maximum value of $F_{max}$, $S_{min}$ is the spring height when the thickness of the piezoelectric resonator, the terminal and the spring member is the maximum value of $T_{max}$ and the dimension range of the case interior is the minimum value of $W_{min}$, and $S_{max}$ is the spring height when the thickness of the piezoelectric resonator, the terminal and the spring member is the minimum value of $T_{min}$ and the dimension range of the case interior is the maximum value of $W_{max}$.

According to another preferred embodiment of the present invention, a method of designing a piezoelectric component which includes a substantially box-shaped case having an opening, a piezoelectric resonator contained in the case, a terminal including a external connecting portion extending from the opening of the case toward an outside of the case, and a spring member contained in the case and arranged to maintain contact with the piezoelectric resonator and the terminal in the thickness direction, the method including the step of designing the spring member such that the piezoelectric resonator and the terminal are held by a holding pressure in a range not larger than $F_{max}$ when a spring height is $S_{min}$ and not smaller than $F_{min}$ when a spring height is $S_{max}$, where a thickness range of the piezoelectric resonator, the terminal and the spring member is not smaller than the minimum value of $T_{min}$ and not larger than the maximum value of $T_{max}$, a dimension range of the case interior is not smaller than the minimum value of $W_{min}$ and not larger than the maximum value of $W_{max}$, a permissible holding pressure range of the piezoelectric resonator and the terminal is not smaller than the minimum value of $F_{min}$ and not larger than the maximum value of $F_{max}$, $S_{min}$ is the spring height when the thickness of the piezoelectric resonator, the terminal and the spring member is the maximum value of $T_{max}$ and the dimension range of the case interior is the minimum value of $W_{min}$, and $S_{max}$ is the spring height when the thickness of the piezoelectric resonator, the terminal and the spring member is the minimum value of $T_{min}$ and the dimension range of the case interior is the maximum value of $W_{max}$.

In preferred embodiments of the present invention, the spring may have linear spring characteristics or non-linear spring characteristics.

Also, it is preferred that the variation range of the dimension of the component and the interior of the case, in other words an admissible range of the spring-height $S_{min}$–$S_{max}$ should be wide.

In addition, the variation of the pressure applied by the spring member when the spring height is low is preferably small.

Further, the original spring height should be low in view of the assembly and the size of the product.

In preferred embodiments of the present invention, the spring can be made of material which is different from that of the terminal. Alternatively, the same material can be used for the spring member and the terminal. For material having a spring characteristic, elastic bodies such as rubber can be used instead of a plate-shape metal spring.

Other features and advantages of the present invention will become apparent from the following description of the invention which refers to the accompanying drawings.

DETAILED DESCRIPTION OF PREFERRED EMBODIMENTS

Figure 1:
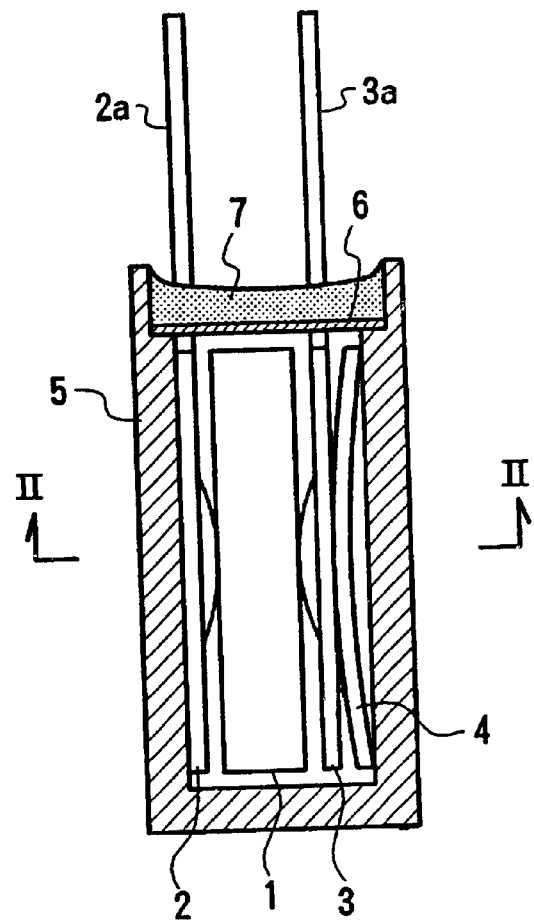
FIG. 1 is a sectional view of an example of a piezoelectric component relating to preferred embodiments of the present invention.
Figure 2:
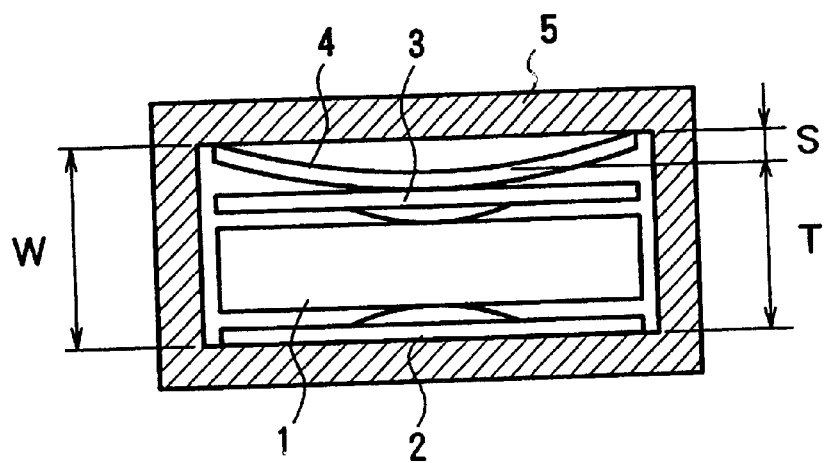
FIG. 2 is a sectional view taken along the line II—II of FIG. 1.

The above described method will be explained hereinafter with reference to FIGS. 1 and 2 which show an example of the piezoelectric component relating to preferred embodiments of the present invention.

Here, the reference numeral 1 denotes a piezoelectric resonator which has electrodes on both front and back surfaces thereof. The reference numerals 2 and 3 denote terminals. The reference numerals 4, 5, 6 and 7 denote a spring member, a case, a resin permeation prevention sheet and a sealing resin, respectively.

The spring member 4 is press-fitted between terminal 3 and the inner-wall of the case 5. The pair of electrodes of the piezoelectric resonator 1 and the terminals 2 and 3 are contacted and electrically connected to each other by a holding pressure applied by the spring member 4. External connecting portions 2a and 3a are integral with the terminals 2 and 3 and arranged to extend outwardly from the case 5.

Suppose that the interior-dimension of the case 5 is W, the total thickness of the components is T, and the spring height of the spring member 4 is S. Here, the spring height S is the height or dimension to which the spring member can deform in the thickness direction and which does not include the thickness of the spring member.

Figure 3:
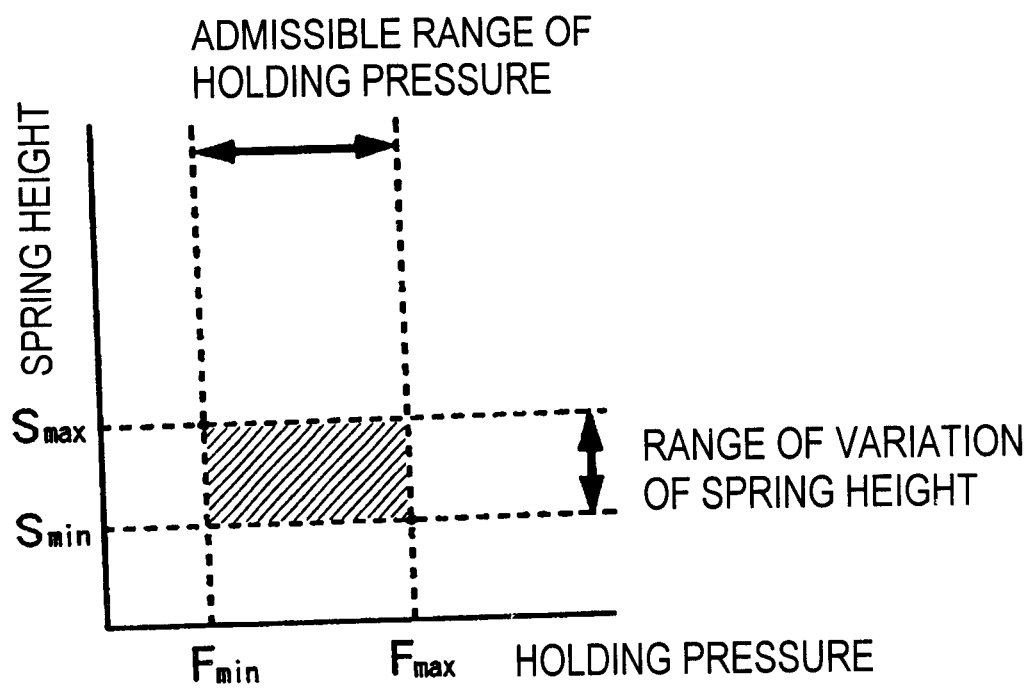
FIG. 3 is a diagram showing a range of the spring height and an admissible pressure range in preferred embodiments of the present invention.
Figure 4:
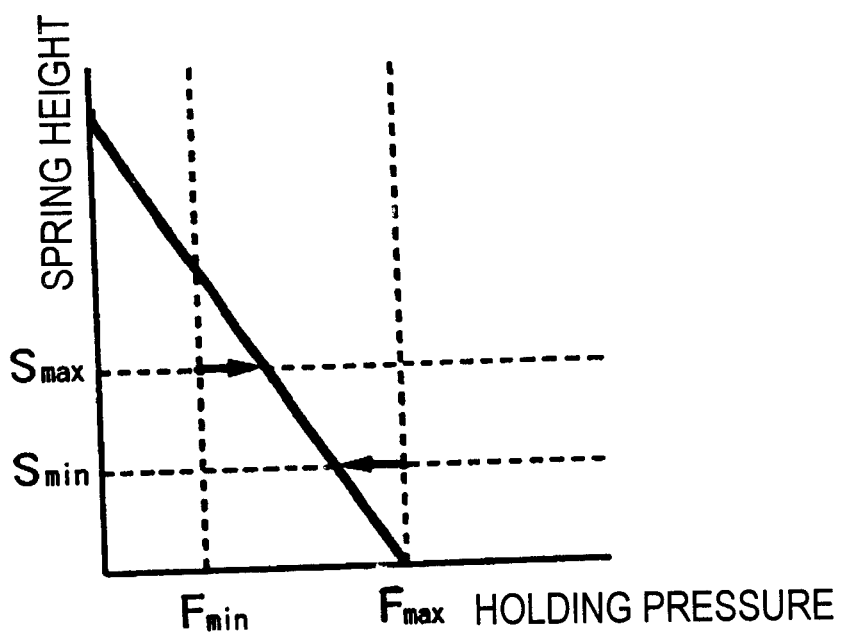
FIG. 4 is a characteristic view of the spring member which has an appropriate spring characteristic.

As shown in FIG. 3, an area indicated by slash lines in the x-y axes in which the horizontal axis indicates the holding pressure and the vertical axis indicates the spring height is set. This area is surrounded by the range of the spring height ($S_{min}$–$S_{max}$) and the permissible range of the holding pressure ($F_{min}$–$F_{max}$). In preferred embodiments of the present invention, the spring member is designed such that the piezoelectric resonator and the terminal are held by a holding pressure in a range not larger than $F_{max}$ when a spring height is $S_{min}$ and not smaller than $F_{min}$ when a spring height is $S_{max}$. For example, when Y=aX+b (a<0, b>0) in which Y is the spring height and X is a spring pressure, the values of a and b are determined such that the line indicating the equation Y=aX+b in the x-y coordinates passes through the upper and lower sides of the above described area, as shown in FIG. 4.

Specifically, the values of a and b preferably satisfy the following two equations;

$$a \leq (S_{max} - S_{min})/(F_{min} - F_{max}) \qquad (1), \text{ and}$$

$$S_{max} - aF_{min} \leq b \leq S_{min} - aF_{max} \qquad (2).$$

By designing the spring member as described above, an appropriate contact pressure F can be obtained even if the variation in the thickness of the piezoelectric resonator, the terminal and the spring member and the variation of the interior-dimension of the case occur. Therefore, a piezoelectric component with high electric reliability is achieved with this structure and arrangement. That is, the problems such as the poor connection, deterioration of the shock resistance, difficulty with assembling and manufacturing, damping of the piezoelectric resonator, can be overcome with preferred embodiments of the present invention.

Figure 5:
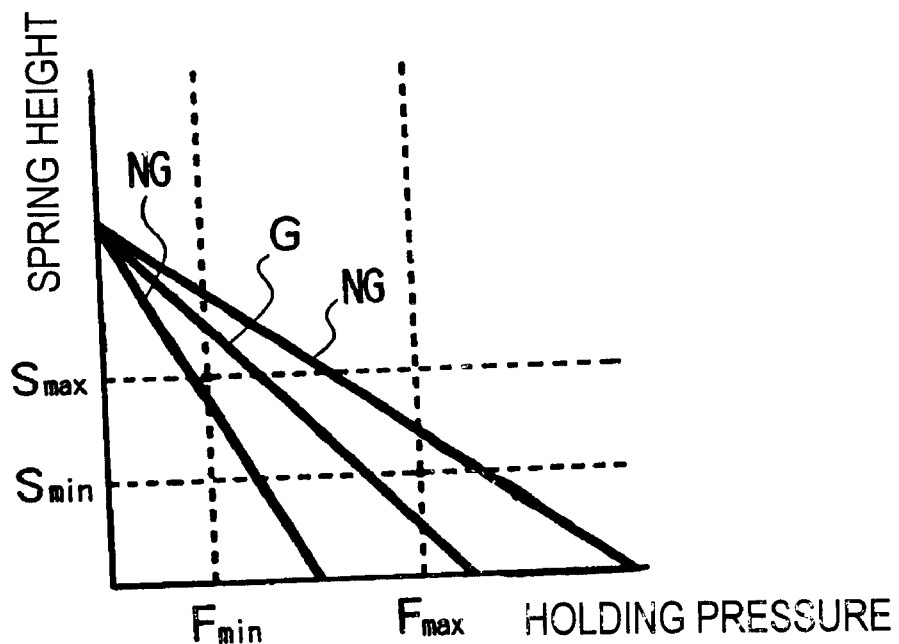
FIG. 5 is a view showing one example of a method of adjusting the spring characteristic.
Figure 6:
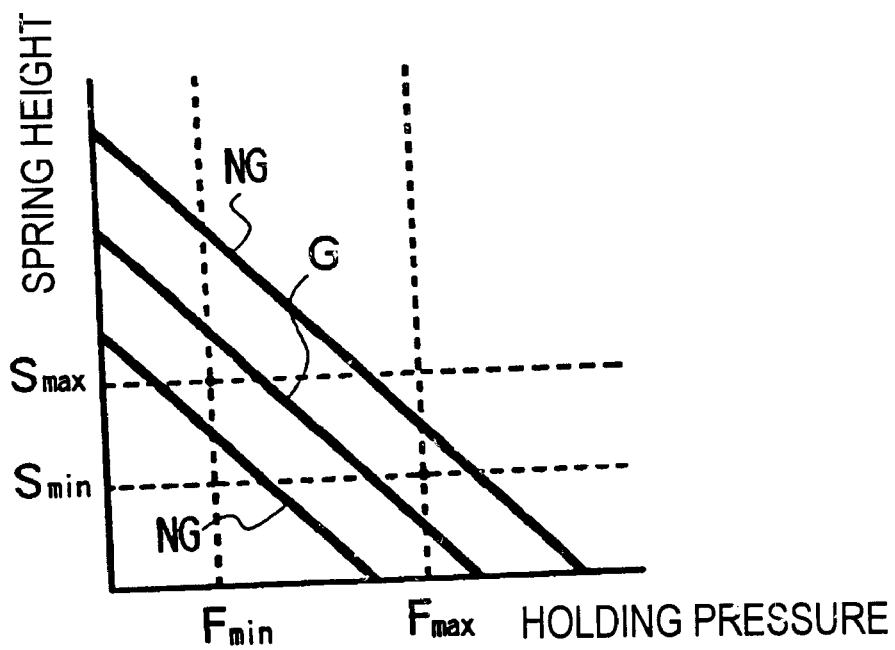
FIG. 6 is a view showing another example of a method of adjusting the spring characteristic.

The spring constant of the spring member (=1/a) indicated as an oblique line shown in FIG. 5 can be adjusted by a material, a thickness, a shape and other characteristics of the spring. When changing the holding pressure without changing the spring constant, the oblique line can be adjusted by changing the original spring height (=b) as shown in FIG. 6. In such a way, it is possible to obtain the appropriate spring characteristic by setting a suitable combination of the amounts of the spring constant (oblique) and the original spring heights.

In addition, in FIG. 5 and FIG. 6, the line "G" is an appropriate spring characteristic, and the line "NG" is an inappropriate spring characteristic.

Figure 7:
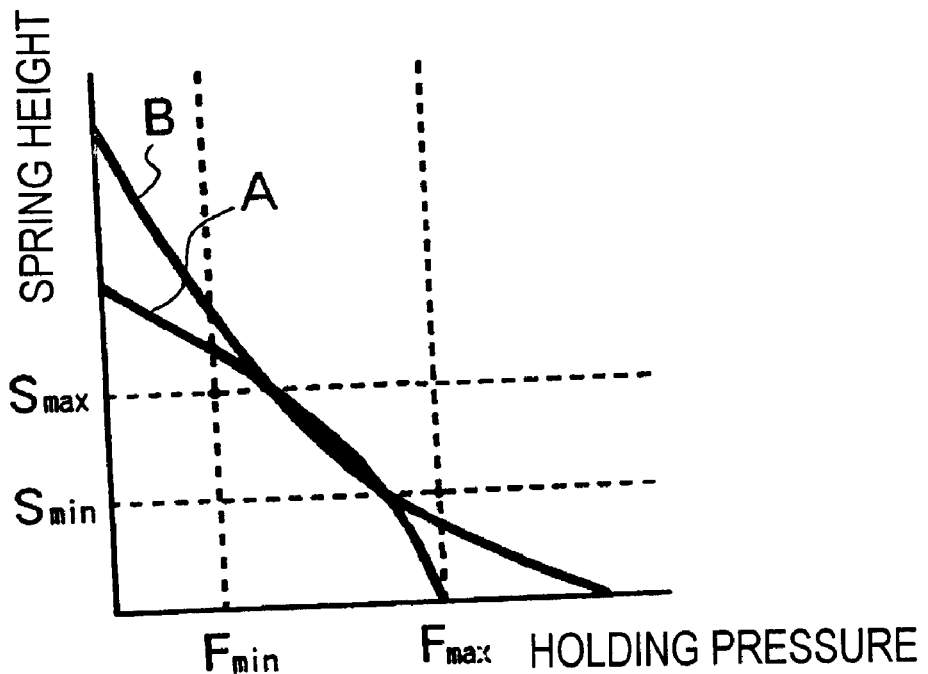
FIG. 7 is a view showing a spring characteristic when a spring has non-linear characteristics.

Further, it is noted that the present invention is not restricted to the above-described linear spring characteristics. The spring member which has a non-linear spring characteristic may also be used. That is, if the spring characteristic has a substantially convex-shape as shown in FIG. 7, the original spring height can be made low which is advantageous for assembly. Moreover, the variation of the pressure applied by the spring member when the spring height is low is small. It is suitable for actual usage, and the interior-dimension of the case can be made small, and thereby, the size of the case can be greatly reduced.

On the other hand, if the spring member has a substantially concave-shape spring characteristic B as shown in FIG. 7, the original spring height becomes very high. In this case, the assembly becomes difficult, and the variation of the pressure by the spring member when spring height is low is large which is not suitable for actual usage. The component may be used when the spring height is high, but this causes a disadvantage that the case itself becomes large.

The outline of the preferred characteristics of the spring member which holds a piezoelectric resonator and a terminal is as follows:

Firstly, the variation range of the dimension of the component and the interior of the case, in other words a permissible range of the spring-height $S_{min}$–$S_{max}$ should be wide.

Secondly, the variation of the pressure by the spring member when the spring height is low is preferably small.

Thirdly, the original spring height should be low in view of the assembly and the size of the product.

Figure 8:
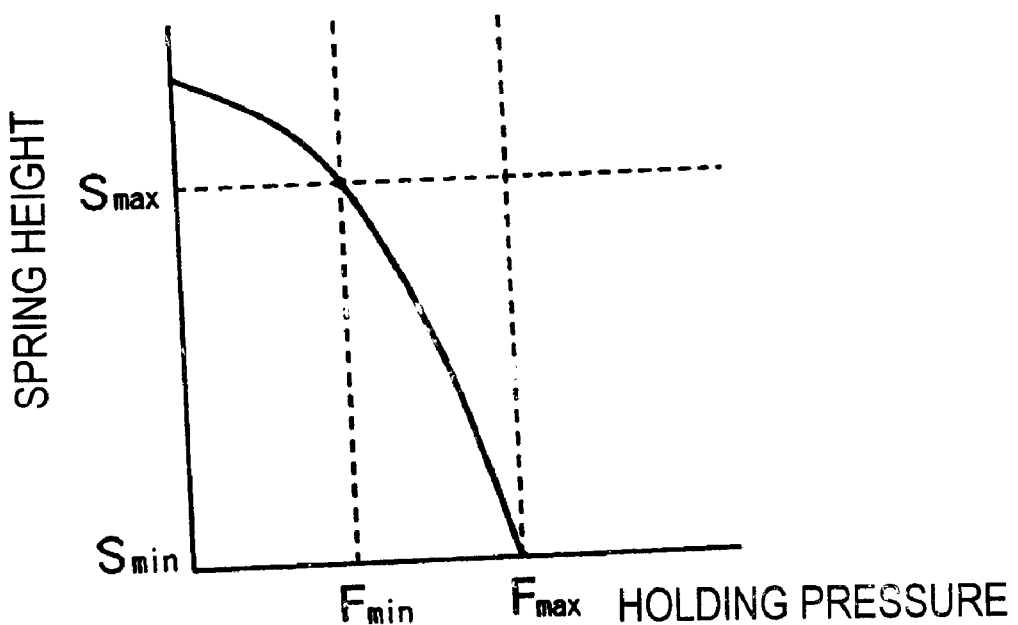
FIG. 8 is a view showing an ideal spring characteristic.

In view of the above, the spring characteristic having a substantially convex shape is preferable. In order to make the size of the product as small as possible, when the thickness of the component is the maximum and the interior of the case is minimum, the spring height should be set to 0. That is, as shown in FIG. 8, it is ideal that $S_{min}=0$.

In preferred embodiments of the present invention, it is not necessary to form the spring member of a material which is different from that of the terminal. The same material can be used for the spring member and the terminal. For material having a spring characteristic, elastic bodies such as rubber can be used instead of a plate-shape metal spring.

Figure 9:
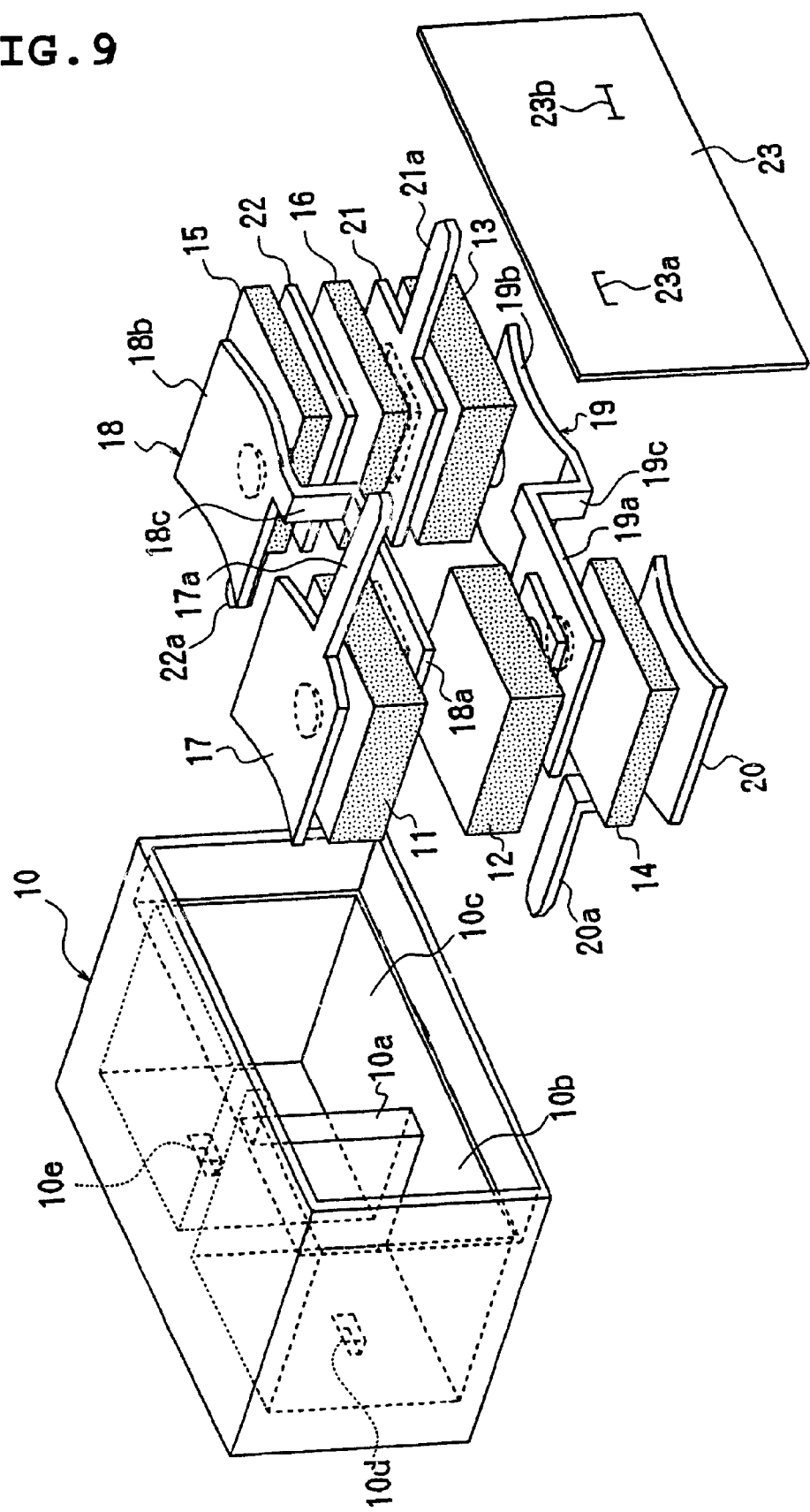
FIG. 9 is an exploded perspective view of an example which preferred embodiments of the present invention are applied to a ladder filter.
Figure 10:
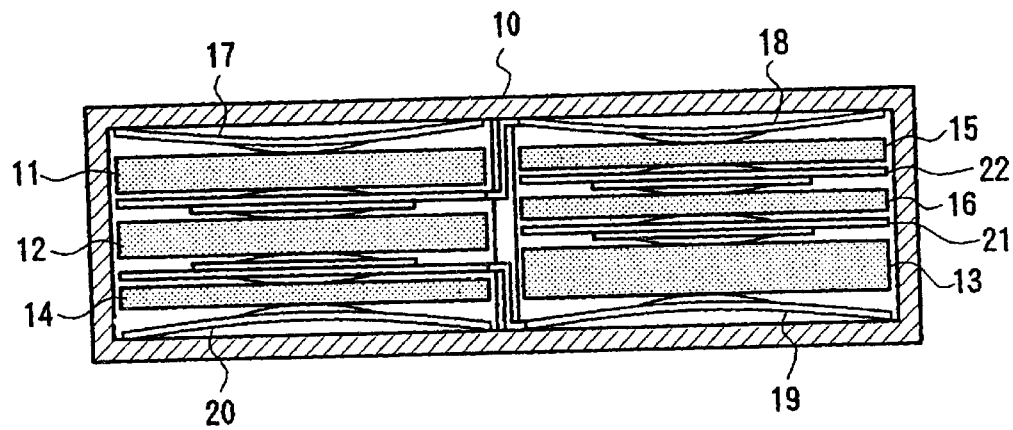
FIG. 10 is a sectional view of the ladder filter shown in FIG. 9.
Figure 11:
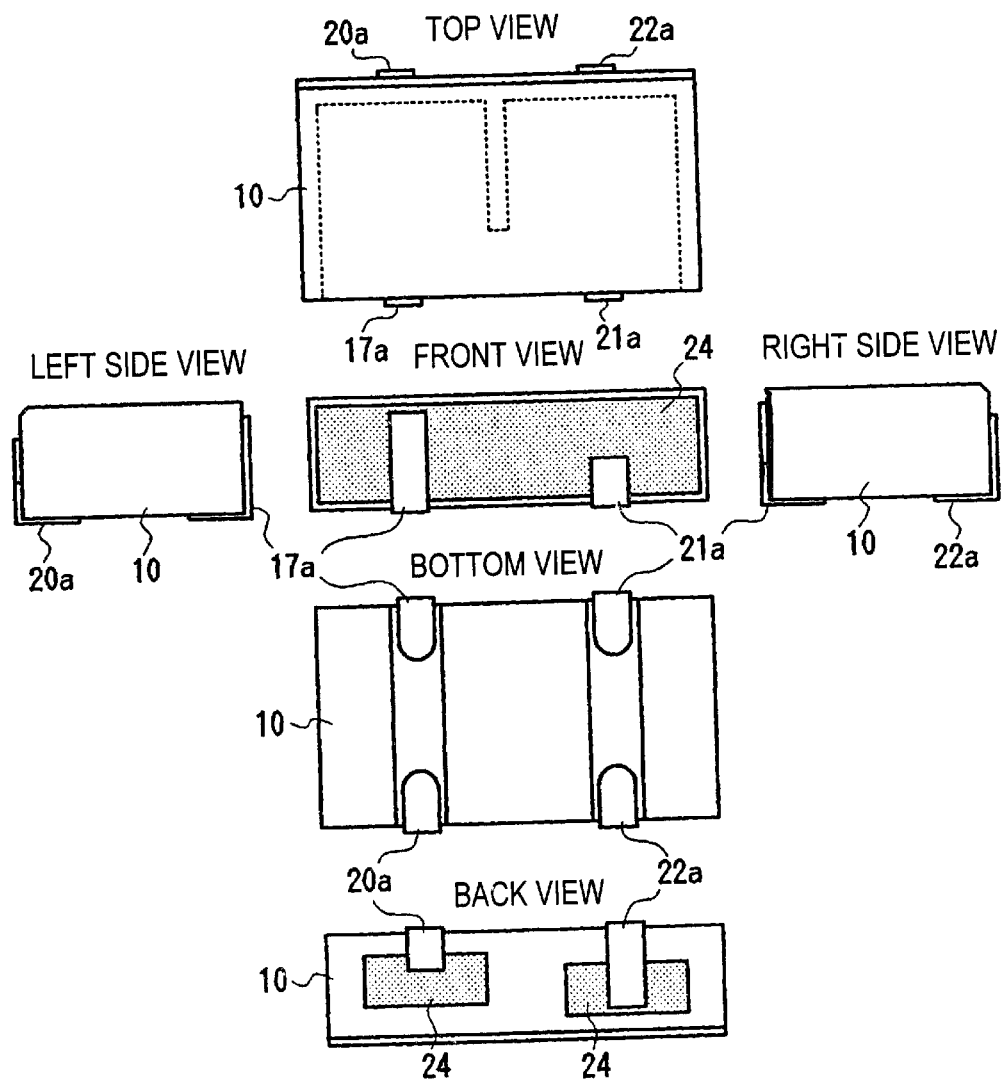
FIG. 11 shows a top view, a front view, right and left side views, a bottom view and a back view of the ladder filter shown in FIG. 9.

FIGS. 9–11 show a surface-mount type ladder filter which is an example of a piezoelectric component of preferred embodiments of the present invention.

Figure 12:
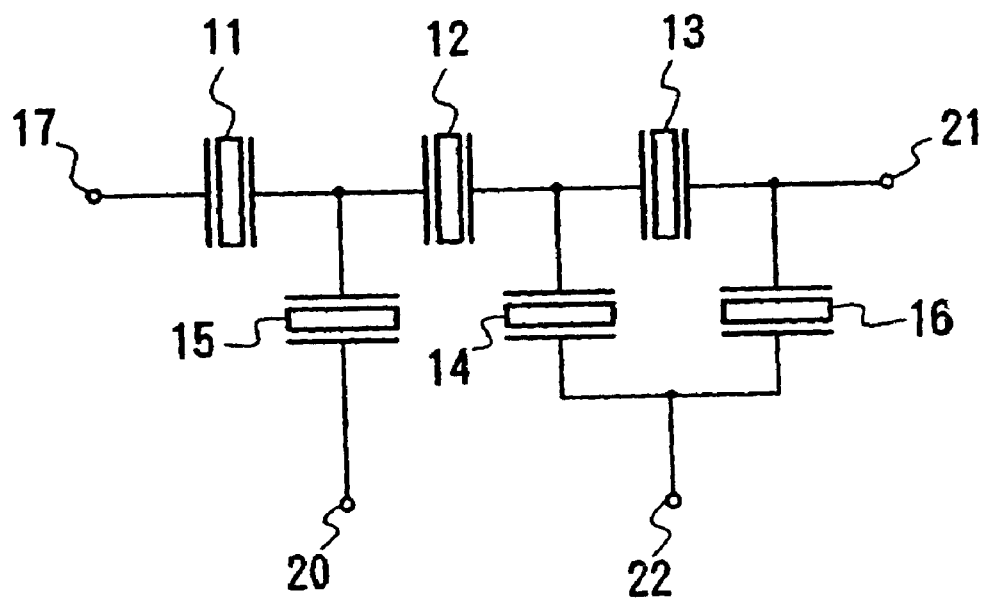
FIG. 12 is a circuit diagram of the ladder filter shown in FIG. 9.

This ladder filter preferably has a plurality of elements and constitutes a ladder circuit shown in FIG. 12. The interior of a case 10 is divided into two chambers 10b and 10c by a partition-wall 10a. In one chamber 10b, series-resonators 11 and 12, a parallel-resonator 14, an input terminal 17, one electrode-plate portion 18a of a connecting terminal 18, one electrode-plate portion 19a of a connecting terminal 19 and a grounding terminal 20 are provided. In the other chamber 10c, a series-resonator 13, parallel-resonators 15 and 16, an output terminal 21, the other electrode-plate portion 18b of a connecting terminal 18, the other electrode-plate portion 19b of a connecting terminal 19 and a grounding terminal 22 are provided.

Both of the series-resonators 11–13 and the parallel-resonators 14–16 are preferably piezoelectric resonators which are adapted to be vibrated in a square type vibration mode, and electrodes are provided on front and back surfaces thereof.

One side of the case 10 is opened via an opening. An external connecting portion 17a of the input terminal 17 and an external connecting portion 21a of the output terminal 21 are respectively extended out from the opening. A sheet 23 for resin penetration prevention is fitted to the opening of the case 10, and a sealing resin 24 is filled thereon. In addition, slits 23a and 23b (see FIG. 9) for deriving the external connecting portions 17a and 21a of the input terminal 17 and the output terminal 21 are provided on the sheet 23. Two terminal draw-through holes 10d and 10e are provided on the opposite side of opening of the case 10. The external connecting portions 20a and 22a of the grounding terminals 20 and 22 are respectively drawn from these draw-through holes 10d and 10e. The terminal draw-through holes 10d and 10e of case 10 are also filled with a sealing resin 24. Accordingly, the full sealing of the interior of the case 10 is achieved.

After filling the resin 24, external connecting portions 17a, 20a, 21a and 22a which are drawn out from the case 10 are bent downwardly along the side-wall of the case 10 and further bent inwardly along the bottom surface of the case 10, as shown in FIG. 11.

In the ladder filter of this preferred embodiment, the input terminal 17 and the grounding terminal 20 are preferably defined by a curved plate-shape spring and function as a spring member. The connecting terminals 18 and 19 have a structure which respectively integrally connects the two electrode-plate portions 18a and 18b, and 19a and 19b in the shape of a crank via the narrow connectors 18c and 19c. Further, the electrode-plate portions 18b and 19b are curved respectively to thereby allow the connecting terminals 18 and 19 to function as a spring member. Thus, since the spring member is not used as a discrete and independent element, the number of elements and parts can be reduced, and cost reduction and size-reduction are achieved.

Hereinafter, a method of designing the input terminal 17, the grounding terminal 20 and the electrode-plate portions 18b and 19b of the connecting terminals 18 and 19 which are spring members in the above described ladder filter will be explained.

First, the thickness variation range of the piezoelectric resonators 11–16 and the terminals 17–22 is preferably set to about 2120+/−180 (1940–2300) micrometers, and the variation range of the interior size of the case 10 is preferably set to about 2400+/−20 (2380–2420) micrometers. In this case, the range of the spring height is about 80–480 micrometers since 2380−2300=80 micrometers and 2420−1940=480 micrometers.

In the above described ladder filter, since two spring members are disposed in each of the chambers 10b and 10c, the permissible range of the spring height is about 40 micrometers to about 240 micrometers.

On the other hand, in view of damping of the piezoelectric resonator, shock resistance, assembly, and other factors, the range of the holding pressure (contact pressure) of the piezoelectric resonators 11–16 and the terminals 17–22 is preferably about 100 g to about 300 g. This range is known as a proper range of the holding pressure of the piezoelectric resonator from experience.

Therefore, a permissible range of the holding pressure is not larger than about 300 g when the spring height is about 40 micrometers and not smaller than about 100 g when the spring height is about 240 micrometers.

The above relationship will be expressed by the equation (1). Since $S_{min}=40$ micrometers, $S_{max}=240$ micrometers, $F_{max}=300$ g and $F_{min}=100$ g, $a \leq (240-40)/(100-300)$ i.e., $a \leq -1.0$ (micrometers/g).

A spring made of an appropriate material and having an appropriate thickness and shape which satisfies the above described condition is preferred. For example, when the material is phosphor bronze, the shape is a curved plate shape, the value of "a" is determined as shown in Table 1 in accordance with the thickness 70, 100 and 150 micrometers.

TABLE 1

| Thickness | 70 micrometers | 100 micrometers | 150 micrometers |
|---|---|---|---|
| a | −1.4 | −1.0 | −0.7 |

As apparent from Table 1, if the thickness is not larger than about 100 micrometers, the above condition of "a" is satisfied. In this case, the spring having the thickness of 70 micrometers (a=−1.4) is selected.

Next, the value of "b" will be calculated. When substituting the above-mentioned values ($S_{min}=40$ micrometer, $S_{max}=240$ micrometer, $F_{max}=300$ g, $F_{min}=100$ g), the equation (2) becomes as follows:

$240-(-1.4) \times 100 \leq b \leq 40-(-1.4) \times 300$ i.e., $380 \leq b \leq 460$ (micrometers)

Here, "b" is determined to be 450 micrometers.

As described above, the spring member of the above ladder filter is determined as follows: Material: Phosphor bronze, Thickness: 70 micrometer, Shape: curved plate shape, Original height: 450 micrometers.

Figure 13:
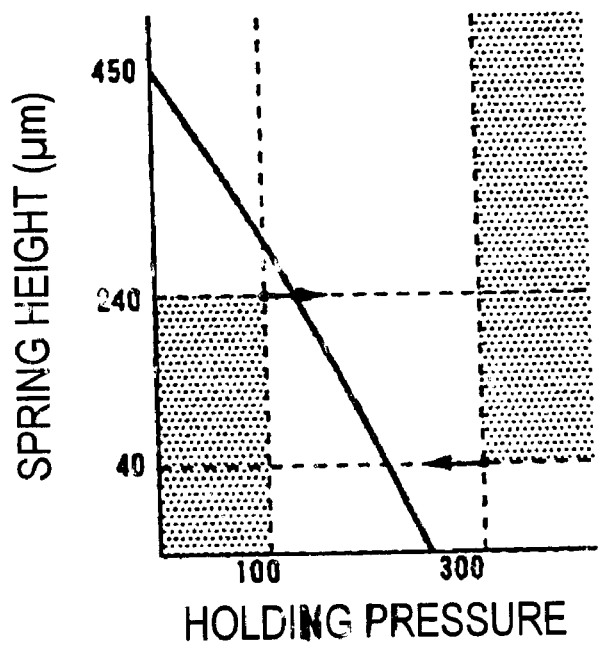
FIG. 13 is a characteristic view of the spring member of the ladder filter shown in FIG. 9.

FIG. 13 shows the spring characteristic of the spring member determined as above in the X-Y coordinates, in which the horizontal-axis indicates holding pressure and the vertical-axis indicates the spring height.

As it is apparent from FIG. 13, the spring characteristic satisfies the initial setting range which is determined as described above. In other words, the spring characteristic satisfies an appropriate range.

In this preferred embodiment, a curved shape plate spring is preferably used as a spring member. However, the present invention is not restricted to this type of spring, and plate springs having various other shapes such as a shape of a cross-dome, may also be used.

The shape of the case and the shape of the piezoelectric resonator are not restricted to those provided in preferred embodiments described above. Further, in the preferred embodiments, the terminal is preferably used as the spring member. However, it is possible to provide a spring member that is separate from the terminal.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing a piezoelectric component comprising the steps of:
   providing a case having an opening;
   placing a piezoelectric resonator in the case;
   arranging a terminal including an external connecting portion in the case and so as to extend from the opening of the case to outside of the case;
   designing and forming a spring member;
   arranging the spring member in the case and to maintain contact with the piezoelectric resonator and the terminal in the thickness direction; wherein
      the step of designing and forming the spring member includes the step of designing the spring member such that the piezoelectric resonator and the terminal are held by a holding pressure applied by the spring and that is in a range not larger than $F_{max}$ when a spring height is $S_{min}$ and not smaller than $F_{min}$ when a spring height is $S_{max}$, where a thickness range of the piezoelectric resonator, the terminal and the spring member is not smaller than the minimum value of $T_{min}$ and not larger than the maximum value of $T_{max}$, a dimension range of the case interior is not smaller than the minimum value of $W_{min}$ and not larger than the maximum value of $W_{max}$, a holding pressure range of the piezoelectric resonator and the terminal is not smaller than the minimum value of $F_{min}$ and not larger than the maximum value of $F_{max}$, $S_{min}$ is the spring height when the thickness of the piezoelectric resonator, the terminal and the spring member is the maximum value of $T_{max}$ and the dimension range of the case interior is the minimum value of $W_{min}$, and $S_{max}$ is the spring height when the thickness of the piezoelectric resonator, the terminal and the spring member is the minimum value of $T_{min}$ and the dimension range of the case interior is the maximum value of $W_{max}$; and
   $F_{min}$ is about 100 g, $F_{max}$ is about 300 g, $S_{min}$ is about 40 $\mu$m, $S_{max}$ is about 240 $\mu$m, $T_{min}$ is about 1940 $\mu$m, $T_{max}$ is about 2300 $\mu$m, $W_{min}$ is about 2380 $\mu$m, and $W_{max}$ is about 2420 $\mu$m.

2. The method according to claim 1, wherein when $Y=aX+b(a<0, b>0)$ in which Y is the spring height and X is a spring pressure, the values of a and b are determined to satisfy the following two equations:

$$a \leq (S_{max}-S_{min})/(F_{min}-F_{max}) \text{ and}$$
$$S_{max}-aF_{min} \leq b \leq S_{min}-aF_{max}.$$

3. The method according to claim 1, wherein the pair of electrodes of the piezoelectric resonator and the terminals are in contact and electrically connected to each other by a holding pressure applied by the spring member.

4. The method according to claim 1, wherein the external connecting portions are integral with the terminals and are arranged to extend outwardly from the case.

5. The method according to claim 1, wherein the spring member is designed to have linear spring characteristics.

6. The method according to claim 1, wherein the spring member is designed to have non-linear spring characteristics.

7. The method according to claim 1, wherein the spring member is designed to have a substantially convex shape spring characteristic.

8. The method according to claim 1, wherein the spring member is designed to have a substantially concave shape spring characteristic.

9. The method according to claim 1, wherein the spring member is made of a material that is different from that of the terminal.

10. The method according to claim 1, wherein the spring member is made of a material that is the same as that of the terminal.

11. The method according to claim 1, wherein piezoelectric component is a surface-mount type ladder filter.

12. A method of designing a piezoelectric component which includes a case having an opening, a piezoelectric resonator contained in the case, a terminal including an external connecting portion extending from the opening of the case to outside of the case, and a spring member arranged in the case and to maintain contact with the piezoelectric resonator and the terminal in the thickness direction, the method comprising the steps of:
   designing the spring member such that the piezoelectric resonator and the terminal are held by a holding pressure applied by the spring and that is in a range not larger than $F_{max}$ when a spring height is $S_{min}$ and not smaller than $F_{min}$ when a spring height is $S_{max}$, where a thickness range of the piezoelectric resonator, the terminal and the spring member is not smaller than the minimum value of T min and not larger than the maximum value of $T_{max}$, a dimension range of the case interior is not smaller than the minimum value of $W_{min}$ and not larger than the maximum value of $W_{max}$, a holding pressure range of the piezoelectric resonator and the terminal is not smaller than the minimum value of $F_{min}$ and not larger than the maximum value of $F_{max}$, $S_{min}$ is the spring height when the thickness of the piezoelectric resonator, the terminal and the spring member is the maximum value of $T_{max}$ and the dimension range of the case interior is the minimum value of $W_{min}$, and $S_{max}$ is the spring height when the thickness of the piezoelectric resonator, the terminal and the spring member is the minimum value of $T_{min}$ and the dimension range of the case interior is the maximum value of Wmax; and
   forming the spring member according to the characteristics determined in the step of designing the spring member; wherein
   $F_{min}$ is about 100 g, $F_{max}$ is about 300 g, $S_{min}$ is about 40 $\mu$m, $S_{max}$ is about 240 $\mu$m, $T_{min}$ is about 1940 $\mu$m, $T_{max}$ is about 2300 $\mu$m, $W_{min}$ is about 2380 $\mu$m, and $W_{max}$ is about 2420 $\mu$m.

13. The method according to claim 12, wherein when Y=aX+b (a<0, b>0) in which Y is the spring height and X is a spring pressure, the values of a and b are determined to satisfy the following two equations:

$a \leq (S_{max} - S_{min})/(F_{min} - F_{max})$ and $S_{max} - aF_{min} \leq b \leq S_{min} - aF_{max}$.

14. The method according to claim 12, wherein the spring member is designed to have linear spring characteristics.

15. The method according to claim 12, wherein the spring member is designed to have a substantially convex shape spring characteristic.

16. The method according to claim 12, wherein piezoelectric component is a surface-mount type ladder filter.

* * * * *